United States Patent
Cranford, Jr. et al.

(10) Patent No.: US 6,717,997 B1
(45) Date of Patent: Apr. 6, 2004

(54) APPARATUS AND METHOD FOR CURRENT DEMAND DISTRIBUTION IN ELECTRONIC SYSTEMS

(75) Inventors: Hayden Clavie Cranford, Jr., Apex, NC (US); Joseph Andrew Iadanza, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/204,025

(22) Filed: Dec. 1, 1998

(51) Int. Cl.$^7$ .................................................. H04L 7/00
(52) U.S. Cl. ...................................... 375/354; 375/343
(58) Field of Search ................................. 375/354, 356, 375/362, 371, 373, 37 J; 370/503, 507, 517; 327/141, 144, 146, 147, 149, 152, 153, 155, 156, 158, 161, 162

(56) References Cited

U.S. PATENT DOCUMENTS

| | | | |
|---|---|---|---|
| 5,124,569 A | * | 6/1992 | Phillips ....................... 327/150 |
| 5,485,490 A | * | 1/1996 | Leung et al. |
| 5,596,610 A | * | 1/1997 | Leung et al. |
| 5,751,665 A | * | 5/1998 | Tanoi |
| 5,799,051 A | * | 8/1998 | Leung et al. |
| 6,111,712 A | * | 8/2000 | Vishakadatta et al. |
| 6,208,667 B1 | * | 3/2001 | Caldara et al. |

* cited by examiner

*Primary Examiner*—Jean B. Corrielus
(74) *Attorney, Agent, or Firm*—Joscelyn G. Cockburn

(57) ABSTRACT

In an electronic system such as a communications integrated circuit including a plurality of components, e.g., transmitters, each of which are operative to demand current responsive to a control signal applied thereto, an apparatus for time-distributing current demand comprises a first phase control circuit configured to receive a reference clock signal and operative to generate a synchronized output signal therefrom, the first phase control circuit generating a phase control signal for synchronizing the output signal to the reference clock signal. A plurality of second phase control circuits is responsive to at least one input control signal and to the phase control signal and operative to apply a plurality of phased output control signals to the plurality of components, the phased output control signals phased with respect to one another by time intervals that are dependent upon the phase control signal. In an embodiment, the first phase control circuit comprises a ring oscillator including a first string of delay circuits operative to produce a plurality of output signals that are phased with respect to one another according to a phase control signal applied thereto. A loop control circuit is configured to receive a reference clock signal and an output signal from a delay circuit of the ring oscillator and operative to produce the phase control signal therefrom. The plurality of second phase control circuits may comprise a second string of delay circuits, e.g., delay circuits such as those in the first string. Fine phase granularity and stable signal phasing can thereby be provided. Related operating methods are also described.

40 Claims, 5 Drawing Sheets

APPARATUS AND METHOD FOR CURRENT DEMAND DISTRIBUTION IN ELECTRONIC SYSTEMS

RELATED APPLICATION

The present application is related to U.S. Pat. No. 6,249,164 issued Jun. 19, 2001 entitled "Delay Circuit Arrangement for Use in a DAC/Driver Waveform Generator with Phase Lock Rise Time Control," assigned to the assignee of the present invention, filed Sep. 25, 1998, and incorporated by reference herein in its entirety.

FIELD OF THE INVENTION

The present invention relates to electronic systems, devices and methods of operation thereof, and more particularly, to electronic systems and devices having components with current demands that are highly correlated with a common clock signal or other timing reference, and methods of operation thereof.

BACKGROUND OF THE INVENTION

Communications systems are increasingly making use of highly-integrated devices for implementing functions such as network hubs, switches, routers, repeaters and the like. For example, integrated communications circuits such as fast Ethernet transceivers (FETs) have been developed that can provide multi-port media access control for physical media such as twisted pair cable, fiber optic lines and the like. Typical multi-port transceivers or media access control devices (MACs) employ multiple copies of single port transceiver circuits that share common circuit blocks such as clock generators and reference voltage and current generators. Clock signals used to control the driving of physical media by transceivers on such a chip are commonly driven from a common point on the chip, or are phase-locked to a clock signal generated by a master clock generation circuit.

Transceivers on conventional multi-port communications devices typically drive physical media at multiple ports in phase. For example, in a conventional multi-port device configured as a repeater, data received at an input port is transported to a plurality of output ports and then typically is applied to physical media at the ports in a simultaneous or nearly simultaneous fashion. This can give rise to a significant instantaneous current demand when the output channels are driven. Devices that supply current to the output transceivers, including on-chip regulators and off-chip power supplies, generally must be sized to meet this instantaneous demand. In addition, current spikes associated with increased instantaneous demand can cause noise that can compromise system performance. Although these performance issues are acute in communications devices, similar power and noise management issues may arise in other electronic devices and systems, e.g., synchronous systems such as computers, microprocessors, digital signal processors, and the like, that include components having current demands that are highly-correlated with a shared clock domain.

It is has been proposed that noise problems associated with the simultaneous current demand of circuits can be ameliorated by staggering the control signals that operate the circuits, as described, for example, in "Noise Reduction in VLSI Chips," IBM Technical Disclosure Bulletin, vol. 33, no. 9, pp. 476–477 (February 1991), "Staggered Block Write in a Storage Array," IBM Technical Disclosure Bulletin, vol. 30, no. 10, p. 298 (March 1988), "Electromagnetic Interference Reduction Through Time Distribution of Clock Signals," IBM Technical Disclosure Bulletin, vol. 37, no. 7, pp. 165–168 (July 1994), "Self-Adjusting Stagger Circuit for Drivers," IBM Technical Disclosure Bulletin, vol. 28, no. 5, pp 2178–2180 (October 1985), "Output Buffer Control Logic," IBM Technical Disclosure Bulletin, vol. 34, no. 8, pp. 300–303 (January 1992), and U.S. Pat. No. 5,646,543 to Rainal. These conventional approaches typically utilize chains of delay elements, e.g., chains of inverters or logic gates, to provide the staggered control signals.

However, devices such as high-speed network transceivers typically operate under demanding timing requirements. For example, a multi-port fast Ethernet transceiver (FET) chip implementing a 100Tx (IEEE standard 802.3) class 1 or a class 2 repeater has a through-time requirement of 0.7 microseconds and 0.46 microseconds, respectively, i.e., times on the order of the period of a typical 20–25 MHZ clock used to operate the chip. In order to implement control signal staggering for the multiple transceivers in such a chip, precise and stable delays on the order of nanoseconds are desirable to avoid errors caused, for example, by violation of set-up and hold time requirements of the transceivers. Conventional delay chains may be incapable of providing sufficiently precise and stable delays.

SUMMARY OF THE INVENTION

In light of the foregoing, it is an object of the present invention to provide electronic systems and devices that exhibit reduced instantaneous switching current demands in comparison to conventional devices.

It is another object to provide systems, devices and operating methods that can provide improved noise suppression.

It is another object of the present invention to provide systems, devices and operating methods that can implement control signal staggering with precise and stable phase control.

These and other objects, features and advantages are provided according to the present invention by apparatus, devices and methods in which a first phase control circuit, e.g., a phase locked loop, is operative to synchronize an output signal thereof through intermediate generation of a phase control signal, and in which a plurality of second phase control circuits, e.g., delay elements, is operative to produced phased output control signals from at least one input control signal responsive to the phase control signal. For example, in an embodiment of the present invention, a phase locked loop circuit includes a ring oscillator controlled by a loop control circuit that generates the phase control signal from a reference clock signal and an output of the ring oscillator. The phase control signal generated by the phase-lock loop circuit is applied to a string of delay circuits that produce a plurality of phased output control signals that are used to drive a plurality of transmitters, thus providing an apparatus for time-distributing current demand by the transmitters.

The present invention arises from a realization that precise and stable phased control of current demand by components such as transmitters can be achieved by phase-locking an oscillator circuit comprising a sequence of delay circuits to a reference clock signal to determine a phase control signal that can be used to produce precise and stable delays in similar or identical delay circuits. These delay circuits can be used to generate precisely phased control signals for operating the components, without recourse to other methods of defining precise small time intervals, such as the generation of extremely high-frequency clock signals.

In particular, according to the present invention, in an electronic system including a plurality of components, each of which are operative to demand current responsive to a control signal applied thereto, an apparatus for time-distributing current demand comprises a first phase control circuit configured to receive a reference clock signal and operative to generate a synchronized output signal therefrom, the first phase control circuit generating a phase control signal for synchronizing the output signal to the reference clock signal. A plurality of second phase control circuits is responsive to at least one input control signal and to the phase control signal and operative to apply a plurality of phased output control signals to the plurality of components, the phased output control signals phased with respect to one another by time intervals that are dependent upon the phase control signal. The first phase control circuit may comprise a phase-locked loop circuit operative to produce the phase control signal from a comparison of the reference clock signal and the output signal, and the plurality of second phase control circuits may comprise a plurality of delay circuits, each configured to receive the phase control signal and an input control signal and operative to produce a delayed output signal that is delayed with respect to the input control signal by a time interval dependent on the phase control signal.

In an embodiment according to the present invention, the first phase control circuit comprises a ring oscillator including a first string of delay circuits operative to produce a plurality of output signals that are phased with respect to one another according to a phase control signal applied thereto. A loop control circuit is configured to receive a reference clock signal and an output signal from a delay circuit of the ring oscillator and operative to produce the phase control signal therefrom. The plurality of second phase control circuits may comprise a second string of delay circuits, e.g., delay circuits such as those in the first string.

In another embodiment according to the present invention, a communications device, e.g., an integrated circuit device such as a fast Ethernet transceiver (FET), includes a plurality of transmitters, each of which is operative to drive a physical medium responsive to a control signal applied thereto. A first phase control circuit, e.g., a phase-locked loop circuit, is configured to receive a reference clock signal and operative to generate a synchronized output signal therefrom, the first phase control circuit generating a phase control signal for synchronizing the output signal to the reference clock signal. A plurality of second phase control circuits is responsive to at least one input control signal and to the phase control signal and operative to apply a plurality of phased output control signals to the plurality of transmitters, the phased output control signals phased with respect to one another by time intervals that are dependent upon the phase control signal. The device may further comprise a register coupled to an input of one of the plurality of transmitters, and the plurality of second phase control circuits may include a phase control circuit coupled to the register and operative to apply a first phased output control signal thereto, and a phase control circuit coupled to the one transmitter and operative to apply a second phased output control signal thereto. In this manner, precise timing compensation may be provided to prevent data loss in configurations such as network repeaters or switching hubs. Related methods of operating such systems and devices are also described.

DETAILED DESCRIPTION OF EMBODIMENTS

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
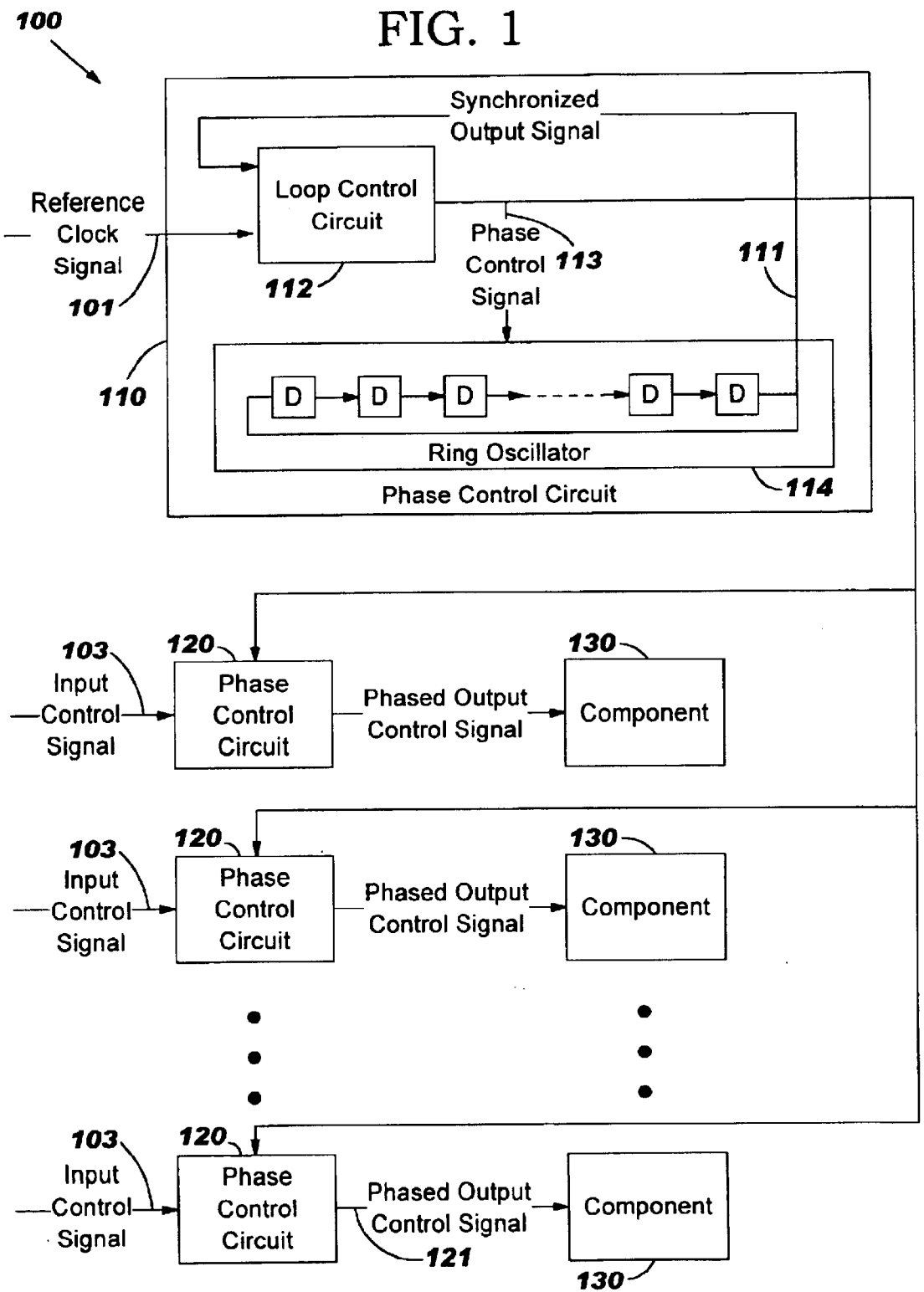
FIG. 1 is a schematic diagram illustrating an electronic system according to an embodiment of the present invention.

In an embodiment of the present invention illustrated in FIG. 1, an electronic system 100 includes a plurality of components 130 that demand current responsive to control signals applied thereto. A first phase control circuit 110 includes a ring oscillator circuit 114 comprising a first string of delay circuits D. A loop control circuit 112 controls the ring oscillator circuit 114, generating a phase control signal 113 that phase locks a synchronized output signal 111 to a reference clock signal 101 by varying delays of the string of delay circuits D, and which is also applied to a plurality of second phase control circuits 120. The second phase control circuits 120 are configured to receive input control signals 103 and operative to generate phased output control signals 121 that are phased dependent upon the applied phase control signal 113. The phased output control signals 121 are applied to the components 130 to time-distribute current demand by the components.

As illustrated, the first phase control circuit includes a loop control circuit 112 that is configured to receive the reference clock signal 101 and the synchronized output signal 111 and operative to generate the phase control signal 113 based on a comparison thereof. In this manner, the delays produced by the delay circuits D may be varied to produce phase agreement or "lock" between the output signal 111 and the reference clock signal 101. An example of such a phase control circuit 110 is described in the related U.S. Pat. No. 6,249,164 entitled "Delay Circuit Arrangement for Use in a DAC/Driver Waveform Generator with Phase Lock Time Control," assigned to the assignee of the present invention, filed Sep. 25, 1998, and incorporated by reference herein in its entirety. Those skilled in the art will appreciate that other phase control circuits that generate phase control signals may also be used with the present invention. When such a phase control circuit is coupled to the second phase control circuits 120, controlled delays can be produced such that the phased output control signals 121 are phased with respect to one another by time intervals that are on the order of nanoseconds, i.e., fractions of the clock period of the reference clock signal 101.

Figure 2:
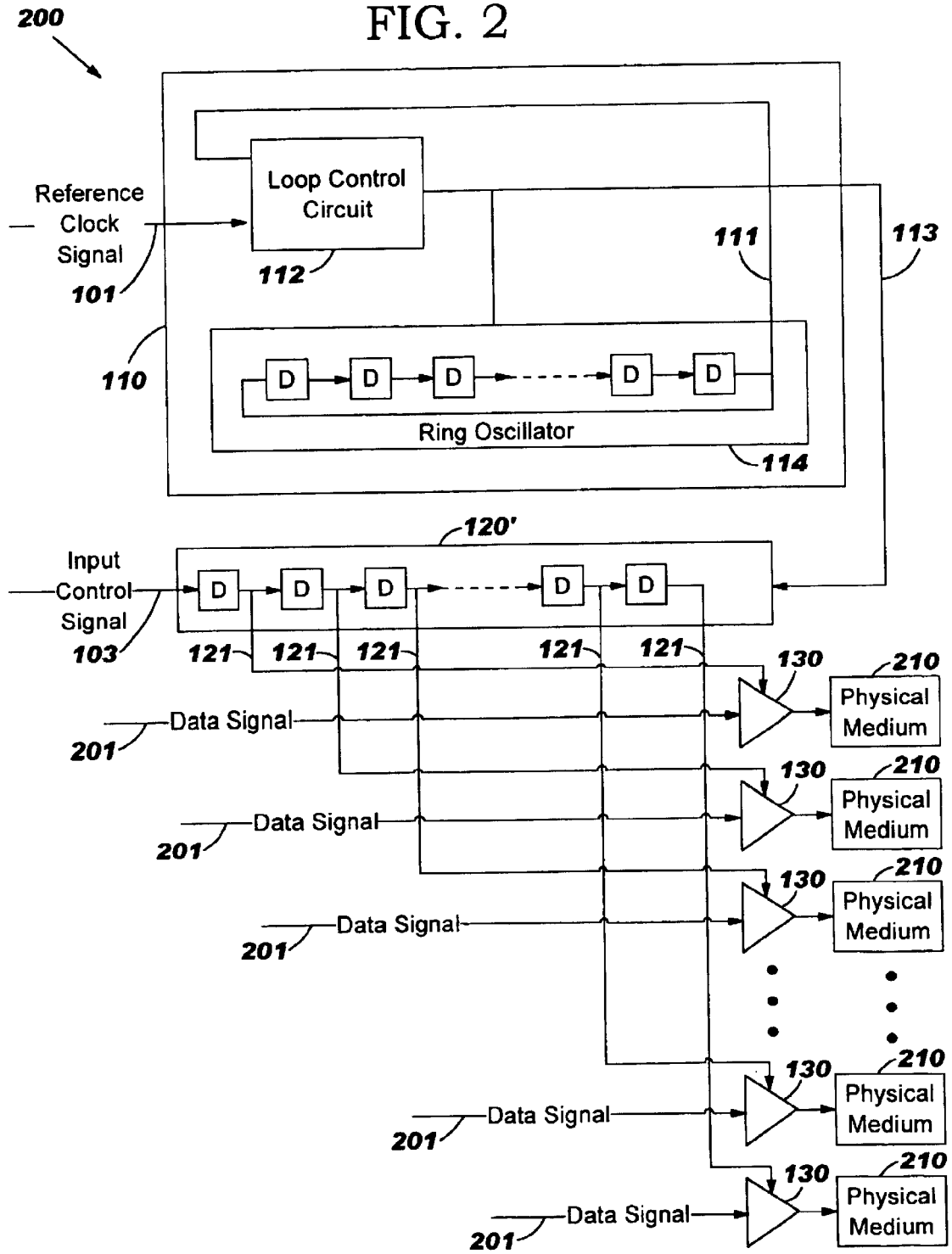
FIG. 2 is a schematic diagram illustrating a communications device according to an embodiment of the present invention.

FIG. 2 illustrates another embodiment according to the present invention, in which a communications device 200, for example, an integrated circuit communications device formed on a microelectronic substrate, includes a first phase control circuit 110 including a ring oscillator circuit 114 including a first string of delay circuits D that produce an output signal 111 that is phase locked to a reference clock signal 101 through the action of a loop control circuit 112 based on a comparison of the reference clock signal 101 and the output signal 111. A plurality of second phase control circuits is provided in the form of a second string 120' of delay circuits D. The second string 120' of delay circuits D receive an input control signal 103, e.g., a bus clock or similar data strobe signal, and produce a plurality of phased output control signals 121 that are applied to a plurality of transmitters 130 to drive physical media 210, e.g., twisted pair cable, bus conductors or the like, responsive to data signals 201 in a manner that time-distributes current demand by the transmitters 130.

Figure 3:
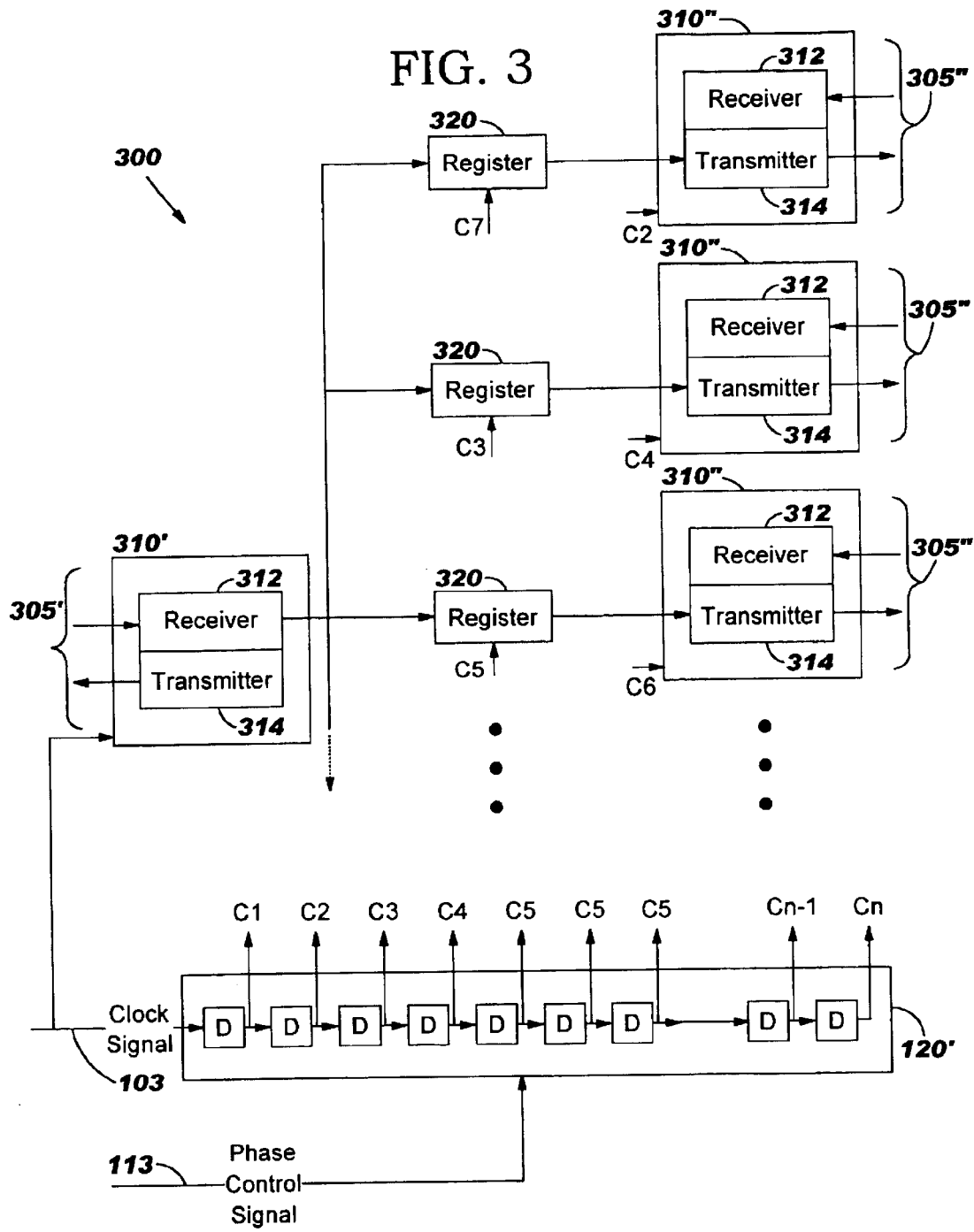
FIG. 3 is a schematic diagram illustrating a repeater device according to an embodiment of the present invention.

In a network repeater embodiment according to the present invention illustrated in FIG. 3, a communications device 300, e.g., a fast Ethernet transceiver (FET), includes a plurality of physical layer devices (PHYs) or transceivers 310', 310", which include receivers 312 and transmitters 314. The transceivers 310', 310" are connected in a repeater configuration that provides connectivity between a physical medium, e.g., twisted pair cable, at a first port 305' and physical media at a plurality of second ports 305" via intermediate registers 320. Those skilled in the art will appreciate that the device 300 generally may include additional transmit and receive controls (not shown) that provide for broadcast of packets generated within the repeater domain, as well as filtering and direction control for packets sent out of the repeater domain. General operational principles of such receive and control circuitry is known to those skilled in the art, and further detailed discussion thereof is not necessary to the understanding of the present invention.

The transceivers 310', 310" and the registers 320 are controlled by a string 120' of delay circuits D that produce phased clock signals C1–Cn from an input clock signal 103 responsive to phase control signal 113 generated, for example, by the phase control circuit 110 of FIG. 1. The multi-phase clock signals C1–Cn according to this aspect of the present invention can provide known, constant latency between the master transceiver 310'and each of the transceivers 310" on the multi-port side of the device 300. The intermediate registers 320 can provide timing corrections required for signal phasing, and can ensure that set up and hold requirements of the multi-port transceivers 310" are satisfied.

By way of illustration of operational characteristics of the device 300, when data packets are received at the first port transceiver 310', typically according to a receive clock signal (RXCLK) that generally has no set relation to the clock signal 103, they are interpreted by the aforementioned receive control circuits to insure that they are to be broadcast in the local repeater domain. If validated, the packets are sent to the second port transceivers 310". In a typical conventional multi-port transceiver device, the packets would be presented to the multi-port side transceivers 310" concurrently, and transmission of this data at the second ports 305" would typically occur in a nearly simultaneous fashion, resulting in a significant instantaneous current demand. According to the illustrated embodiment, this demand is distributed by selectively applying the phased clock signals C1–Cn to the transceivers 310".

The phased clock signals C1–Cn preferably are provided to the second port transceivers 310" and the registers 320 in such a way that for each combination of a register 320 and a transceiver 310", data is registered in time to satisfy the setup time requirement of the transceiver 310" and is held sufficiently at the input of the transceiver 310" to meet the transceiver's hold time requirement. As the packet validation and control functions associated with receive control circuits of the device 300 may introduce latency, registers 320 associated with second port transceivers 310" that are phased closest to the first port transceiver 310' may use clock signals of the clock signals C1–Cn that are phased toward the end of the timing chain defined by the clock signals C1–Cn if the clock signal 103 and the receive clock have a fixed relationship. Alternatively, phase granularity may be enlarged and/or first-in-first-out (FIFO) buffering added to desensitize the system to an asynchronous clock environment by operating the transceivers 310', 310" one or more data cycles behind the receive control.

The precise phase control provided by the phased clock signals C1–Cn can allow the device 300 to maintain fine phase granularity under varying environmental conditions. For example, in embodiments in which the first and second phase control circuits 110, 120' are implemented using like delay circuits D fabricated on a common microelectronic substrate, e.g., in a single integrated circuit, excellent process and environmental stability may be achieved.

Figure 4:
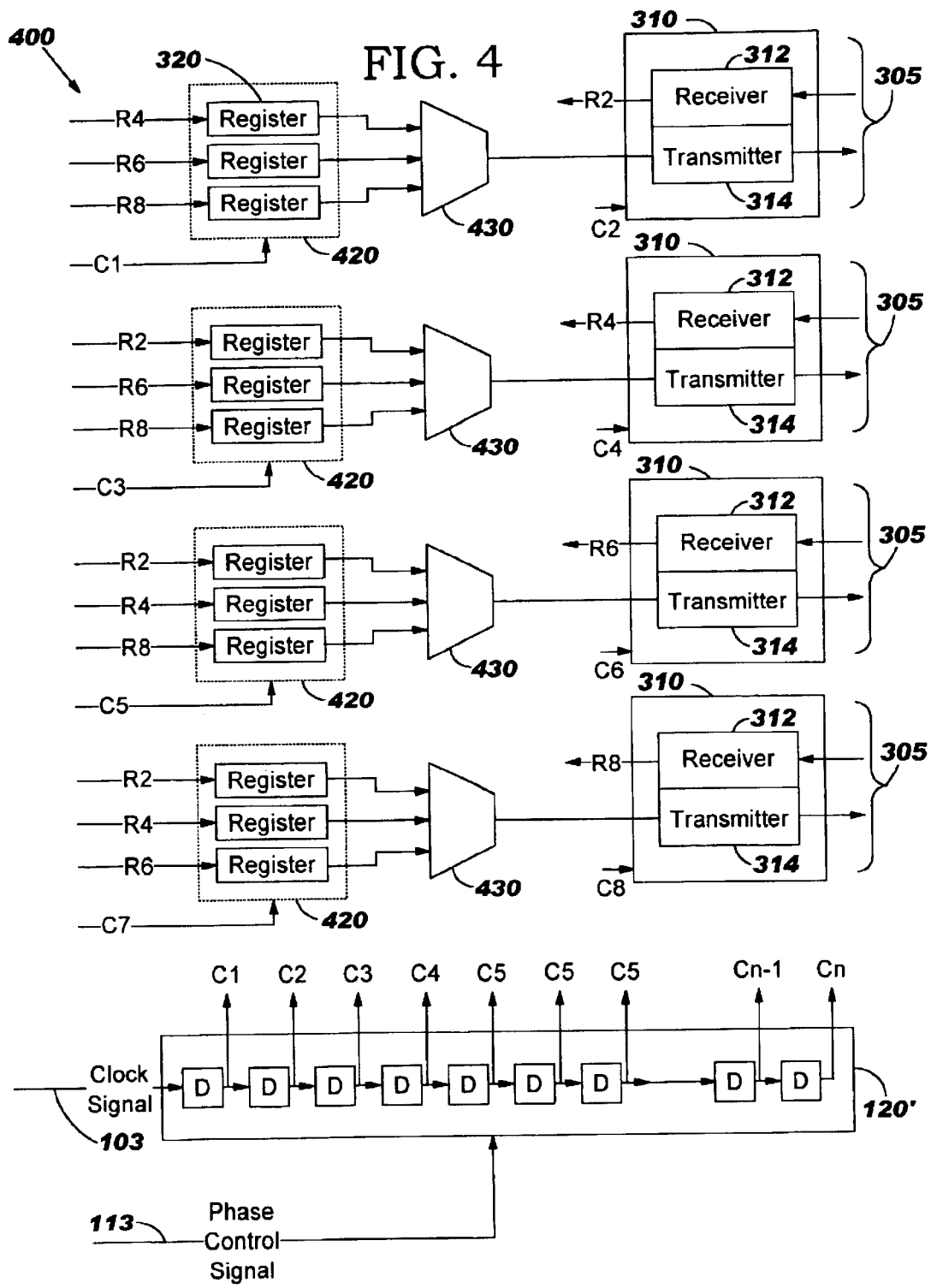
FIG. 4 is a schematic diagram illustrating a hub device according to another embodiment of the present invention.

In a switching hub embodiment of the present invention illustrated in FIG. 4, a communications device 400, e.g., a fast Ethernet transceiver (FET), includes a plurality of transceivers (PHYs) 310 for interfacing to physical media at a plurality of ports 305, each of which include a receiver 312 and a transmitter 314. The transceivers 310 provide connectivity between physical media at multiple ports 305, via intermediate groups 420 of registers 320 connected to select control circuits 430 that variably route data packets between the transceivers 310.

The transceivers 310 and the registers 320 are controlled by a string 120' of delay circuits D that produce phased clock signals C1–Cn from an input clock signal 103 responsive to phase control signal 113 generated, for example, by the phase control circuit 110 of FIG. 1. The multi-phase clock signals C1–Cn according to this aspect of the present invention can provide known, constant phasing between the transceivers 310. The intermediate registers 320 can provide timing corrections required for signal phasing in a manner similar to that described with respect to the aforementioned repeater embodiment.

As a hub or router typically continually changes receive-to-transmit paths between the transceivers 310, the registers 320 can be used to latch data from all potential sources using a clock signal of the clock signals C1–Cn that ensures proper data transfer to the transmitting transceiver. The receivers 312 may also be clocked using a phased clock signal that ensures proper data transfer to the appropriate registers 320. Although this may constrain the number of ports which the device 400 can support, additional circuits may be provided to ensure coherence between the receive clocks at the ports 305 and the clock signals provided to the registers 320 or FIFO buffering added to reduce sensitivity to asynchronous clock effects.

Those skilled in the art will appreciate that the above-described concepts may be extended. For example, some systems include a single media access control device (MAC) servicing multiple PHYs. A phased clocking system as described above may be employed in such a system, with the available clock phases partitioned not only at the register-to-PHY and port-to-port levels, but also at the MAC-to-MAC level.

Figure 5:
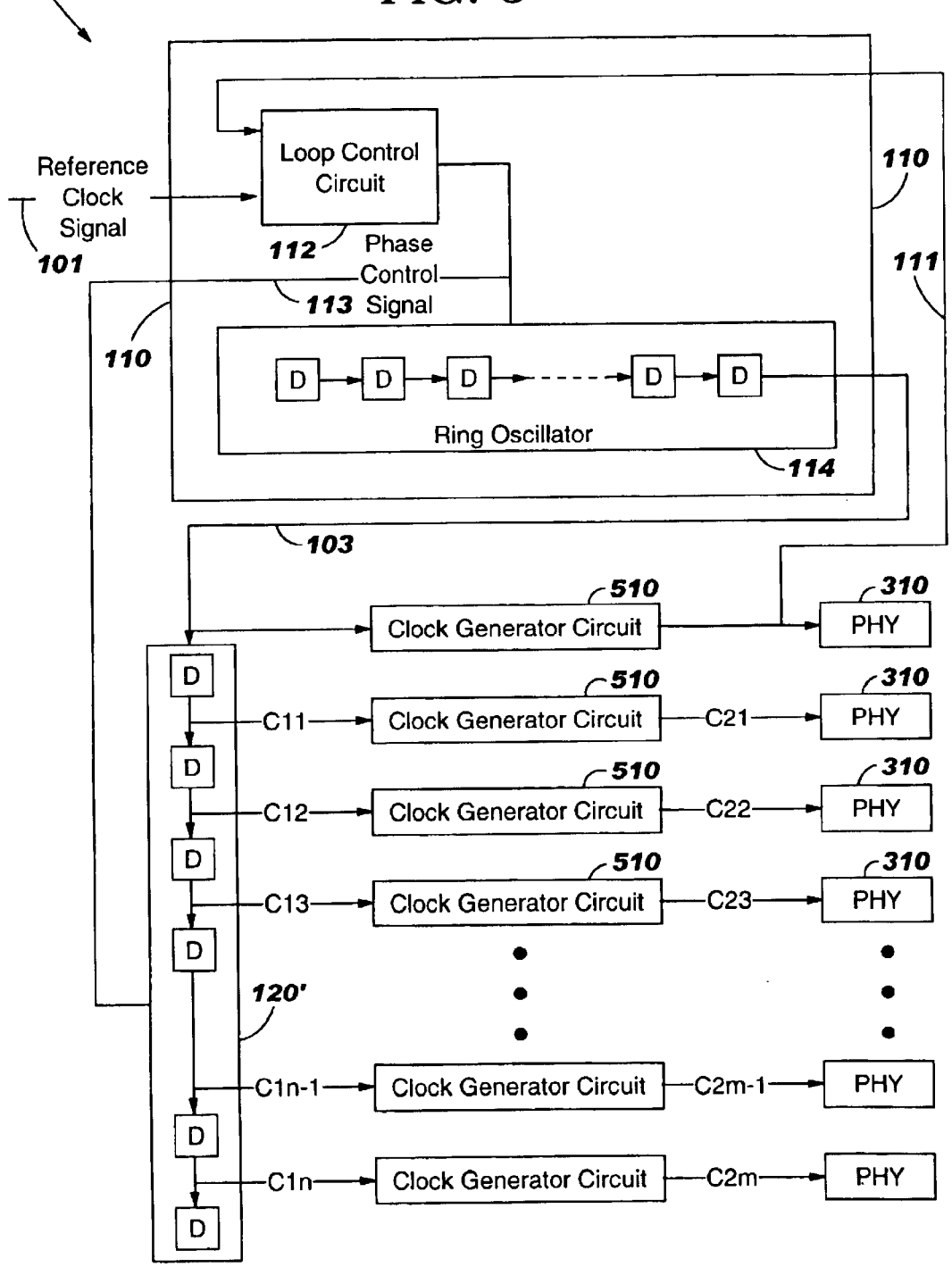
FIG. 5 is a schematic diagram illustrating a clock distribution system according to another exemplary embodiment of the present invention.

In another exemplary embodiment illustrated in FIG. 5, a clock distribution system 500 for providing phased clock signals to multiple PHYs 310 includes a phase control circuit 110 that provides a phase control signal to a string 120' of delay elements, producing a first plurality of phased clock signals C1–Cn from an output clock signal 103 of the phase control circuit 110. The first plurality of phased clock signals C1l–C1n are in turn provided to a plurality of clock generator circuits 510 that produce a second plurality of phased clock signals C21–C2m. The phase control circuit 110 synchronizes a clock signal 111 produced by a clock generator circuit 510 that receives the output signal 103 produced by the phase control circuit 110 to a reference clock signal 101. In general, the clock generator circuits 510 may implement a variety of clock processing functions, such as clock division to support multi-speed protocols. The phase clock signals produced by such an arrangement as the clock distribution system 500 can be used to achieve current demand distribution among the PHYs 310 that has fine granularity and high stability.

In the drawings and specification, there have been disclosed typical and preferred embodiments of the invention and, although specific terms are employed, they are used in a generic and descriptive sense only and not for purposes of limitation, the scope of the invention being set forth in the following claims.

That which is claimed is:

1. In electronic system including a plurality of components, each of which are operative to demand current responsive to a control signal applied thereto, an apparatus for time-distributing current demand comprising:
    a first phase control circuit configured to receive a reference clock signal and operative to generate a synchronized output signal therefrom, said first phase control circuit generating a phase control signal for synchronizing the output signal to the reference clock signal; and
    a plurality of second phase control circuits responsive to at least one input control signal, not generated within any of the plurality of second phase control circuit, and to the phase control signal and operative to apply a plurality of phased output control signals to the plurality of components, the phased output control signals being offset in time with respect to one another by time intervals that are dependent upon the phase control signal.

2. In electronic system including a plurality of components, each of which are operative to demand current responsive to a control signal applied thereto, an apparatus for time-distributing current demand comprising:
    a first phase control circuit configured to receive a reference clock signal and operative to generate a synchronized output signal therefrom, said first phase control circuit generating a phase control signal for synchronizing the output signal to the reference clock signal;
    a plurality of second phase control circuits responsive to at least one input control signal and to the phase control signal and operative to apply a plurality of phased output control signals to the plurality of components, the phased output control signals phased with respect to one another by time intervals that are dependent upon the phase control signal;
    wherein said first phase control circuit comprises a phase-locked loop circuit operative to produce the phase control signal from a comparison of the reference clock signal and the output signal; and
    wherein said plurality of second phase control circuits comprises a plurality of delay circuits, each configured to receive the phase control signal and an input control signal and operative to produce a delayed output signal that is delayed with respect to the input control signal by a time interval dependent on the phase control signal.

3. An apparatus according to claim 2:
    wherein said first phase control circuit comprises:
        a ring oscillator including a first string of delay circuits operative to produce said output signal; and
        a loop control circuit configured to receive the reference clock signal and the output signal and operative to produce the phase control signal therefrom.

4. The apparatus according to claim 3, wherein said plurality of second phase control circuits comprises a second string of delay circuits configured to receive an input control signal and the phase control signal and operative to produce said plurality of phased output control signals.

5. An apparatus according to claim 4, wherein said first string of delay circuits and said second string of delay circuits comprise like delay circuits.

6. An apparatus according to claim 5, wherein said first string of delay circuits and said second string of delay circuits are formed on a common microelectronic substrate.

7. In electronic system including a plurality of components, each of which are operative to demand current responsive to a control signal applied thereto, an apparatus for time-distributing current demand comprising:
    a first phase control circuit configured to receive a reference clock signal and operative to generate a synchronized output signal therefrom, said first phase control circuit generating a phase control signal for synchronizing the output signal to the reference clock signal;
    a plurality of second phase control circuits responsive to at least one input control signal and to the phase control signal and operative to apply a plurality of phased output control signals to the plurality of components, the phased output control signals phased with respect to one another by time intervals that are dependent upon the phase control signal;
    wherein the plurality of components comprises a plurality of transmitters, each of which is operative to drive a load responsive to a respective control signal applied thereto; and
    wherein said plurality of second phase control circuits is coupled to the plurality of transmitters and operative to apply the plurality of phased output control signals to the plurality of transmitters.

8. An apparatus according to claim 7, wherein the plurality of transmitters each comprises a transmitter having a data input coupled to a register, and wherein said plurality of second phase control circuits comprises:
    a phase control circuit coupled to the register and operative to apply a first phased output control signal thereto; and
    a second phase control circuit coupled to the transmitter and operative to apply a second phased output control signal thereto.

9. An apparatus according to claim 8, wherein the first and second phased output control signals satisfy set up and hold time requirements for the transmitter.

10. An apparatus according to claim 8, wherein the register is coupled to a receiver, and wherein said plurality of second phase control circuits comprises each a phase control circuit coupled to a respective receiver and operative to a apply a third phased output control signal thereto.

11. In electronic system including a plurality of components, each of which are operative to demand current responsive to a control signal applied thereto, an apparatus for time-distributing current demand comprising:

a first phase control circuit configured to receive a reference clock signal and operative to generate a synchronized output signal therefrom, said first phase control circuit generating a phase control signal for synchronizing the output signal to the reference clock signal; and a plurality of second phase control circuits responsive to at least one input control signal and to the phase control signal and operative to apply a plurality of phased output control signals to the plurality of components, the phased output control signals phased with respect to one another by time intervals that are dependent upon the phase control signal;

wherein the plurality of components comprises a plurality of physical layer devices (PHYs), each of which is operative to drive a physical medium of a communications network responsive to the control signal applied thereto, and wherein said plurality of second phase control circuits is coupled to the plurality of PHYs and operative to apply the phased output control signals thereto.

12. In electronic system including a plurality of components, each of which are operative to demand current responsive to a control signal applied thereto, an apparatus for time-distributing current demand comprising:

a first phase control circuit configured to receive a reference clock signal and operative to generate a synchronized output signal therefrom, said first phase control circuit generating a phase control signal for synchronizing the output signal to the reference clock signal; and a plurality of second phase control circuits responsive to at least one input control signal and to the phase control signal and operative to apply a plurality of phased output control signals to the plurality of components, the phased output control signals phased with respect to one another by time intervals that are dependent upon the phase control signal; wherein the reference clock signal has a reference clock period, and wherein the time intervals each represent a fraction of the reference clock period.

13. A communications device, comprising:

a plurality of transmitters, each of which operatively drive a physical medium responsive to a control signal applied thereto;

a first phase control circuit configured to receive a reference clock signal and operative to generate a synchronized output signal therefrom, said first phase control circuit generating a phase control signal for synchronizing the output signal to the reference clock signal; and a plurality of second phase control circuits responsive to at least one input control signal and to the phase control signal and operative to apply a plurality of phased output control signals to the plurality of transmitters, the phased output control signals being offset in time with respect to one another by time intervals that are dependent upon the phase control signal, wherein current demanded by said plurality of transmitters is distributed in time by selectively applying said phased output control signals.

14. A communications device, comprising:

a plurality of transmitters, each of which operative drive a physical medium responsive to a control signal applied thereto;

a first phase control circuit configured to receive a reference clock signal and operative to generate a synchronized output signal therefrom, said first phase control circuit generating a phase control signal for synchronizing the output signal to the reference clock signal;

a plurality of second phase control circuits responsive to at least one input control signal and to the phase control signal and operative to apply a plurality of phased output control signals to the plurality of transmitters, the phased output control signals phased with respect to one another by time intervals that are dependent upon the first phase control signal;

wherein said first phase control circuit comprises a phase-locked loop circuit operative to produce the phase control signal from a comparison of the reference clock signal and the output signal; and wherein said plurality of second phase control circuits comprises a plurality of delay circuits, each configured to receive the phase control signal and said at least one input control signal and operative to produce a delayed output signal that is delayed with respect to the input control signal by a time interval dependent on the phase control signal.

15. A device according to claim 14:

wherein said first phase control circuit comprises:

a ring oscillator including a first string of delay circuits operative to produce said output signal; and a loop control circuit configured to receive the reference clock signal and the output signal oscillator and operative to produce the phase control signal therefrom.

16. A device according to claim 15, wherein said plurality of second phase control circuits comprises a second string of delay circuits configured to receive said input control signal and the phase control signal and operative to produce said plurality of phased output control signals.

17. A device according to claim 16, wherein said first string of delay circuits and said second string of delay circuits comprise like delay circuits.

18. A communications device, comprising:

a plurality of transmitters, each of which operative drive a physical medium responsive to a control signal applied thereto;

a first phase control circuit configured to receive a reference clock signal and operative to generate a synchronized output signal therefrom, said first phase control circuit generating a phase control signal for synchronizing the output signal to the reference clock signal;

a plurality of second phase control circuits responsive to at least one input control signal and to the phase control signal and operative to apply a plurality of phased output control signals to the plurality of transmitters, the phased output control signals phased with respect to one another by time intervals that are dependent upon the phase control signal;

a register coupled to an input of one of said plurality of transmitters, and wherein said plurality of second phase control circuits each comprises:

a phase control circuit coupled to said register and operative to apply a first phased output control signal thereto; and a second phase control circuit coupled to said one transmitter and operative to apply a second phased output control signal thereto.

19. A device according to claim 18, wherein said first and second phased output control signals satisfy set up and hold time requirements for said one transmitter.

20. A device according to claim 18, further comprising a receiver coupled to said register, and wherein said plurality of second phase control circuits comprises each a third phase control circuit coupled to said receiver and operative to apply a third phased output control signal thereto.

21. A communications device, comprising:
   a plurality of transmitters, each of which operative drive a physical medium responsive to a control signal applied thereto;
   a first phase control circuit configured to receive a reference clock signal and operative to generate a synchronized output signal therefrom, said first phase control circuit generating a phase control signal for synchronizing the output signal to the reference clock signal;
   a plurality of second phase control circuits responsive to at least one input control signal and to the phase control signal and operative to apply a plurality of phased output control signals to the plurality of transmitters, the phased output control signals phased with respect to one another by time intervals that are dependent upon the phase control signal;
   a receiver coupled to an input of one of said transmitters, and wherein said plurality of second phase control circuits comprises each
   a phase control circuit coupled to said receiver and operative to apply a first phased output control signal thereto; and
   a second phase control circuit coupled to said one transmitter and operative to apply a second phased output control signal thereto.

22. A communications device, comprising:
   a plurality of transmitters, each of which operatively drive a physical medium responsive to a control signal applied thereto;
   a first phase control circuit configured to receive a reference clock signal and operative to generate a synchronized output signal therefrom, said first phase control circuit generating a phase control signal for synchronizing the output signal to the reference clock signal; and
   a plurality of second phase control circuits responsive to at least one input control signal and to the phase control signal and operative to apply a plurality of phased output control signals to the plurality of transmitters, the phased output control signals phased with respect to one another by time intervals that are dependent upon the phase control signal; wherein the reference clock signal has a reference clock period, and wherein the time intervals each represent a fraction of the reference clock period.

23. An apparatus for use in an electronic system including a plurality of components, each of the plurality components operative to demand current responsive to a control signal applied thereto, the apparatus comprising:
   a ring of delay circuits that are responsive to produce an output signal responsive to a phase control signal applied thereto;
   means for determining said phase control signal that synchronizes an output signal of said ring of delay circuits to a reference clock signal;
   a plurality of delay circuits operatively associated with the plurality of components and configured to receive at least one input control signal, said plurality of delay circuits operative to produce a plurality of delayed control signals that are delayed responsive to the phase control signal and to apply the plurality of delayed control signals to the plurality of components to time-distribute current demand by the plurality of components.

24. An apparatus according to claim 23, wherein said means for determining a phase control signal comprises:
   means for applying said phase control signal to said ring of delay circuits; and
   means for comparing an output signal of said ring of delay circuits to the reference clock signal; and
   means for varying the phase control signal based on a comparison reference clock signal and the output signal of the ring of delay circuits.

25. An apparatus according to claim 24, wherein said ring of delay circuits and said plurality of delay circuits comprise like delay circuits.

26. An apparatus according to claim 25, wherein said ring of delay circuits and said plurality of delay circuits are formed on a common microelectronic substrate.

27. An apparatus according to claim 23, wherein said plurality of delay circuits comprises a string of delay circuits operatively associated with the plurality of components and configured to receive said at least one input control signal, said string of delay circuits operative to produce a plurality of delayed control signals that are delayed responsive to the phase control signal and to apply the plurality of delayed control signals to the plurality of components to time-distribute current demand by the plurality of components.

28. An apparatus according to claim 23, wherein the plurality of components comprises a plurality of transmitters, each of which is operative to drive a physical medium connected thereto responsive to a respective control signal applied thereto, and wherein said means for applying the plurality of delayed control signals comprises means for applying the plurality of delayed control signals to the plurality of transmitters to time-distribute driving of physical media connected to the plurality of transmitters.

29. A method of operating an electronic system including a plurality of components, each of the plurality components operative to demand current responsive to a control signal applied thereto, the method comprising the steps of:
   determining a phase control signal that synchronizes an output signal of a first phase control circuit to a reference clock signal;
   applying at least one input control signal and the determined phase control signal to a plurality of second phase control circuits to produce a plurality of phased output control signals that are offset in time with respect to one another by time intervals that are dependent upon the determined phase control signal; and
   applying the plurality of phased output control signals to the plurality of components to time-distribute current demand by the plurality of components.

30. A method of operating an electronic system including a plurality of components, each of the plurality of components operative to demand current responsive to a control signal applied thereto, the method comprising the steps of:
   determining a phase control signal that synchronizes an output signal of a first phase control circuit to a reference clock signal;
   applying at least one input control signal and the determined phase control signal to a plurality of second phase control circuits to produce a plurality of phased output control signals that are phased with respect to one another by time intervals that are dependent upon the determined phase control signal;
   applying the plurality of phased output control signals to the plurality of components to time-distribute current demand by the plurality of components;
   wherein said step of determining a phase control signal comprises the steps of:

applying a generated phase control signal to a ring oscillator including a first string of delay circuits to produce an output clock signal;

varying the phase control signal based on a comparison of the reference clock signal and the ring oscillator output clock signal; and wherein said step of applying said at least one input control signal and the determined phase control signal comprises the step of applying said at least one input control signal and the varied phase control signal to the plurality of second phase control circuits to produce said plurality of phased output control signals.

31. A method according to claim 30, wherein said step of applying at least one input control signal and the determined phase control signal comprises the step of applying one input control signal and the determined phase control signal to a second string of delay circuits to produce said plurality of phased output control signals.

32. A method according to claim 31, wherein the first string of delay circuits and the second string of delay circuits comprise like delay circuits.

33. A method according to claim 32, wherein the first string of delay circuits and the second string of delay circuits are formed on a common microelectronic substrate.

34. A method of operating an electronic system including a plurality of components, each of the plurality components operative to demand current responsive to a control signal applied thereto, the method comprising the steps of:

determining a phase control signal that synchronizes an output signal of a first phase control circuit to a reference clock signal;

applying at least one input control signal and the determined phase control signal to a plurality of second phase control circuits to produce a plurality of phased output control signals that are phased with respect to one another by time intervals that are dependent upon the determined phase control signal;

applying the plurality of phased output control signals to the plurality of components to time-distribute current demand by the plurality of components; and wherein the plurality of components comprises a plurality of transmitters, each of which is operative to drive a physical medium connected thereto responsive to a respective control signal applied thereto, and wherein said step of applying the plurality of phased output control signals comprises the step of applying the plurality of phased output control signals to the plurality of transmitters to time-distribute driving of physical media connected to the plurality of transmitters.

35. A method according to claim 34, wherein a respective one of the plurality of transmitters has a respective data input, and wherein said step of applying the plurality of phased output control signals comprises the steps of:

providing a data signal to an input of one of the plurality of transmitters responsive to a first one of the phased output control signals; and driving a load according to the provided data signal responsive to a second one of the phased output control signals.

36. A method according to claim 35, wherein said first phased output control signal and said second phased output control signal provide predetermined set up and hold times for the one transmitter.

37. A method according to claim 36, wherein said step of providing said data signal comprises the step of latching a data signal into a register connected to the input of the one transmitter responsive to the first phased output control signal.

38. A method according to claim 35, wherein said step of applying the plurality of phased output control signals further comprises the step of sampling a data signal present in a physical medium responsive to a third one of the phased output control signals.

39. A method of operating an electronic system including a plurality of components, each of the plurality components operative to demand current responsive to a control signal applied thereto, the method comprising the steps of:

determining a phase control signal that synchronizes an output signal of a first phase control circuit to a reference clock signal;

applying at least one input control signal and the determined phase control signal to a plurality of second phase control circuits to produce a plurality of phased output control signals that are phased with respect to one another by time intervals that are dependent upon the determined phase control signal; and applying the plurality of phased output control signals to the plurality of components to time-distribute current demand by the plurality of components;

wherein the plurality of components comprises a plurality of physical layer devices (PHYs) in a communications network, each of which is operative to drive a physical medium responsive to a respective, phased output control signal applied thereto, and wherein said step of applying the plurality of phased output control signals comprises the step of applying the phased output control signals to the plurality of PHYs to time-distribute driving of physical media.

40. A method of operating an electronic system including a plurality of components, each of the plurality components operative to demand current responsive to a control signal applied thereto, the method comprising the steps of:

determining a phase control signal that synchronizes an output signal of a first phase control circuit to a reference clock signal; and applying at least one input control signal and the determined phase control signal to a plurality of second phase control circuits to produce a plurality of phased output control signals that are phased with respect to one another by time intervals that are dependent upon the determined phase control signal; and applying the plurality of phased output control signals to the plurality of components to time-distribute current demand by the plurality of components; wherein the reference clock signal has a reference clock period, and wherein the time intervals each represent a fraction of the reference clock period.

* * * * *